US011079564B2

(12) United States Patent
Barnhart (10) Patent No.: US 11,079,564 B2
(45) Date of Patent: Aug. 3, 2021

(54) METHODS AND APPARATUSES FOR ALIGNING AND DIAGNOSING A LASER BEAM (71) Applicant: Cymer, LLC, San Diego, CA (US)

(72) Inventor: Donald Harrison Barnhart, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 0 days.

(21) Appl. No.: 15/655,079

(22) Filed: Jul. 20, 2017

(65) Prior Publication Data

US 2019/0025536 A1    Jan. 24, 2019

(51) Int. Cl.
| G02B 7/00 | (2021.01) |
| G01J 1/04 | (2006.01) |
| G03F 7/20 | (2006.01) |
| G01J 1/42 | (2006.01) |
| G02B 26/10 | (2006.01) |

(52) U.S. Cl.
CPC ............ *G02B 7/003* (2013.01); *G01J 1/0455* (2013.01); *G01J 1/429* (2013.01); *G01J 1/4257* (2013.01); *G02B 26/101* (2013.01); *G03F 7/70258* (2013.01); *G03F 7/70558* (2013.01)

(58) Field of Classification Search
CPC ............ A61B 6/40; A61B 6/542; A61B 6/548
See application file for complete search history.

(56) References Cited

U.S. PATENT DOCUMENTS

| 4,772,122 A | 9/1988 | Kasner |
| 5,939,704 A | 8/1999 | Perrie et al. |
| 6,429,417 B1 | 8/2002 | Street et al. |
| 2005/0219502 A1 | 10/2005 | Sandstrom et al. |
| 2005/0274897 A1* | 12/2005 | Singer ................. G03F 7/70141 250/372 |
| 2010/0060988 A1 | 3/2010 | Bleidistel et al. |

(Continued)

FOREIGN PATENT DOCUMENTS

| JP | 2606227 B2 | 3/1989 |
| JP | H03265816 A | 11/1991 |

(Continued)

OTHER PUBLICATIONS

International Search Report (ISR) dated Oct. 1, 2018 in the counterpart PCT patent application (International App. No. PCT/US 18/41500, International Filing Date Jul. 10, 2018).

(Continued)

*Primary Examiner* — David P Porta
*Assistant Examiner* — Mamadou Faye
(74) *Attorney, Agent, or Firm* — DiBerardino McGovern IP Group LLC (57) ABSTRACT Methods and apparatuses for aligning and diagnosing the laser beam traversing an optical train in a highly space-efficient, lower cost and/or retrofit-friendly manner are disclosed. The optical components of the optical train are mounted such that one or more optical components can direct their exit laser beam to partially or wholly scan across one or more downstream sensors. Correlation data between physical disposition of optical components and the points of impact data and/or beam quality data are employed to, among others, align and/or diagnose the laser beam and/or localize failure sites and/or optimize maintenance schedule.

5 Claims, 8 Drawing Sheets

(56) References Cited

U.S. PATENT DOCUMENTS

2012/0225152 A1\* 9/2012 Wuister ................ B82Y 10/00
                                                         425/150
2015/0198894 A1 7/2015 Wangler et al.

FOREIGN PATENT DOCUMENTS

| JP | H05217844 A | 8/1993 |
|----|----|----|
| JP | H08124828 A | 5/1996 |
| JP | H10116777 A | 5/1998 |
| WO | 2014064224 A1 | 5/2014 |

OTHER PUBLICATIONS

Office Action, counterpart Japanese Patent Application No. 2019-565567, dated Oct. 26, 2020, 7 pages total (including English translation of 4 pages.)
Office Action, counterpart Korean Patent Application No. 10-2020-7001852, dated Apr. 22, 2021, 7 pages total (including English translation of 3 pages).
Office Action, counterpart Chinese Patent Application No. 2018800460162, dated May 26, 2021, 15 pages total (including English translation of 7 pages).

\* cited by examiner

METHODS AND APPARATUSES FOR ALIGNING AND DIAGNOSING A LASER BEAM

BACKGROUND

In many systems that produce a laser beam (such as a laser generator) or employ a laser beam (such as a photolithography system), there is often an optical train that includes one or more optical components (such as mirrors, gratings, prisms, of switches, filters, etc.). The optical train refers to the set of optical components the laser beam traverses. The laser beam enters the optical train and makes one or more exits after passing through the optical train. Optical components of the optical train may, wholly or partially, reflect, process, filter, modify, focus, expand, etc. the laser beam to obtain one or more desired laser beam outputs.

Optimal laser operation often requires that the laser beam be correctly aligned with respect to each optical component of the optical train and/or upon exiting the optical train. Alignment refers to the laser beam intersecting or impacting upon a desired point or points (whether real or virtual in space) after passing through one or more optical components (such as after passing through an optical component or passing through a portion of or the entire optical train). Additionally or alternatively, optimal laser operation also often requires the beam to have certain desired optical characteristics with respect to, for example, footprint, energy, etc. Laser beam diagnostic is an important endeavor and is concerned with, among others, characterizing the laser beam so that optimal laser operation can be achieved and/or maintained.

Improved laser beam alignment and/or laser beam diagnostic apparatuses and methods are subjects of embodiments of the invention herein.

SUMMARY OF THE INVENTION

The invention relates, in an embodiment, to a method for optimizing a laser beam in a photolithography system, the laser beam traversing an optical train that comprises plurality of optical components. The method comprises rasterizing, using a first optical component of the plurality of optical components such that the laser beam that exits the first optical component scans, responsive to the rasterizing using the first optical component, at least partially across a first sensor. The method also includes forming a correlation, using data obtained from the first sensor during the rasterizing using the first optical component, the physical disposition of the first optical component with the point of impact of the laser beam that exits the first optical component. The method additionally includes ascertaining a first physical disposition of the first optical component, using data obtained from the correlation, that would cause the point of impact of the laser beam that exits the first optical component to impact a desired point on a second optical component. The method further includes aligning the laser beam that exits the first optical component with respect to the second optical component by aligning the first optical component in accordance with the first physical disposition determined by the ascertaining.

In another embodiment, the invention relates to a photolithography system having an optical train comprising a plurality of optical components, the plurality of optical components configured to at least pass a laser beam from one location to another location. The photolithography system comprises first optical component configured to at least perform rasterizing a laser beam exiting the first optical component, causing the laser beam exiling the first optical component to at least partially scan across a first sensor. The photolithography system also includes a second optical component configured to at least receive the laser beam that exits the first optical component and perform rasterizing the laser beam exiting the second optical component, causing the laser beam exiting from the second optical component to at least partially scan across a second sensor.

In another embodiment, the invention relates to a method for diagnosing a laser beam, the laser beam configured to generate one of deep ultraviolet (DUV) light and extreme ultraviolet (EUV) light for photolithography, the laser beam traversing at least a first optical component and a second optical component of an optical train in a photolithography system. The method includes, rasterizing, using the first optical component, such that the laser beam that exits the first optical component scans at least partially across a first sensor. The method additionally includes rasterizing, using a second optical component, such that the laser beam that exits the second optical component scans at least partially across a second sensor. The method also includes ascertaining laser beam characteristics from data received from the first sensor and second sensor to facilitate performing the diagnosing the laser beam.

In yet another embodiment, the invention relates to a method for forming a laser beam, the laser beam configured to generate one of deep ultraviolet (DUV) light and extreme ultraviolet (EUV) light for photolithography, the laser beam traversing at least a first optical component and a second optical component of an optical train in a photolithography system. The method includes directing the laser beam, using the first optical component, to a first sub-area of the second optical component during a first period of operation of the photolithography system. The method also includes thereafter directing the laser beam, using the first optical component, to a second sub-area of the second optical component during a second period of operation of the photolithography system, whereby one or more components in the optical train are configured to align the laser beam such that the laser beam point of impact after exiting the optical train is unchanged irrespective whether the photolithography system operates during the first period of operation or during the second period of operation.

BRIEF DESCRIPTION OF THE DRAWINGS

The present invention is illustrated by way of example, and not by way of limitation, in the figures of the accompanying drawings and in which like reference numerals refer to similar elements and in which.

DESCRIPTION OF ONE OR MORE EMBODIMENTS OF THE INVENTION

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art that the present invention may be practiced without some or all of these specific details. In other instances, well known process steps and/or structures have pot been described in detail in order to not unnecessarily obscure the present invention.

In one or more embodiments of the invention, improved apparatuses and methods for laser beam alignment and laser beam diagnostic are disclosed. In one or more embodiments, the physical disposition of the upstream optical component changed over time (preferably over a short period of time) such that the laser beam rasterizes (or sweeps), as a function of the changing physical disposition of the upstream optical component, across a portion of or across the entirety of a downstream sensor. During the sweeping of the laser beam, the physical disposition of the upstream optical component is recorded and correlated relative to the laser beam impact position on the downstream sensor, thereby building correlation data between the physical disposition of the upstream optical component and the laser beam point of impact on the downstream sensor. Note that this alignment method, in accordance with one or more embodiments of the invention, relies on collecting data pertaining to a plurality of laser impact points on the sensor responsive to changing physical dispositions of the upstream optical component to build the correlation. This allows the use of a sensor that is much smaller than the laser beam footprint to build the correlation, as will be discussed later herein.

Physical disposition of the optical component may refer to the X/Y/Z translation of the optical component position relative to some reference position. Alternatively or additionally, physical disposition of the optical component may refer to how the optical component is "pointed." That is, the physical disposition of the optical component may refer to the pitch, yaw, and/or tilt pointing of the optical component relative to some pitch/yaw/tilt reference. Still further, physical disposition of the optical component may refer to any behavior of the optical component that causes the laser beam that exits the optical component to change a subsequent point of impact of the laser beam after exiting the optical component. For example, changing the curvature of a mirror or electronically and/or optically manipulating the beam using an optical component may change next downstream point of impact of the laser beam after exiting the optical component and are also examples of changing the physical disposition of the optical component that performs the rasterizing. In the examples herein, translation and pointing changes are employed as examples to simplify the discussion although it should be understood that such are not limiting of the definition of changing the physical disposition of the optical component for the purpose of raster zing the laser beam that exits the optical component. The physical disposition may be performed manually (i.e., by hand) for optical components mounted on fixtures that permit tuning of the physical disposition, or more preferably by electromechanical actuators that tune the physical disposition responsive to control signals and more preferably responsive to control signals under control by a digital computer.

To further discuss this point using a concrete example, if the optical component is a mirror, for example, physical disposition of that mirror may include how the mirror is translated in the X/Y/Z direction and/or the mirror's pitch/yaw/tilt pointing. By way of example and not intending to impose a limitation, when a given mirror is translated (i.e., moved in the X, Y, or Z direction) and/or when its pointing is changed (i.e., its pitch, yaw and/or tilt is/are changed) in order to change the point of impact of the laser beam that exits that given mirror on a downstream component (such as on a downstream sensor and/or on a downstream optical component), such moving or movement (involving translating and/or pointing change) is referred to herein as "rasterizing" the given optical component.

In one or more embodiments (and not a requirement or limitation of embodiments of the invention herein), the downstream sensor is associated, physically and/or logically, with a downstream optical component that is downstream from the upstream optical component. For example, there may exist an upstream optical component A and a downstream sensor B, with downstream sensor 13 associated with a downstream optical component C. Downstream sensor B may be attached, either directly or indirectly via some mounting apparatus such as for example arms or plates, in front of, beside, or behind the downstream optical component C. As the upstream optical component A changes its physical disposition, the laser beam scans across a portion of or across the entire downstream sensor B, enabling the forming of the aforementioned correlation data.

Once the correlation data is formed, the relationship between the physical disposition of the upstream optical component and the laser beam point of impact on a downstream element is known. It is now also known how the changing the physical disposition of the upstream optical component would change the downstream point of impact. The physical disposition of the upstream optical component may then be tuned to obtain the desired point of impact, thus achieving alignment. In other words, the laser beam can be aligned by performing the appropriate translation of the position of the optical component and/or changing the pointing of the optical component to cause the point of impact of the laser beam that exits that optical component to impact a desired location in space, a desired location on a downstream optical component, or on a downstream sensor. The same technique could be applied successively (and iteratively if desired) on other optical component/sensor pairs downstream of the original upstream optical component, thereby achieving alignment through the entire optical train.

The correlation data may also be stored in a computer system and/or a computer readable medium and/or made available via a computer network for use by other devices and/or for future use. These uses may include alignment, beam diagnostic, localization of failures, maintenance optimization, etc. The term computer or computer system herein refers to any device having one or more logic units and one or more memory units capable of performing calculations, storing the results, etc. irrespective of the form factor. For example, computers may encompass stand-alone devices and/or networked devices and/or virtual computing devices (such as cloud computing).

In the examples herein, mirrors are employed as optical components to simplify the discussion although it should be understood that various different types of optical components may be involved in a real-world optical train. Further, changes in the pitch (pointing up or down) and/or yaw (pointing left or right) angles are employed to represent changes in the physical disposition of the optical component mirror for example. However, it should also be understood that any type of physical disposition change (e.g., X/Y/Z translation and/or tilt/pitch/yaw pointing change) may be involved in accordance with one or more embodiments of the invention.

To achieve the foregoing physical disposition changes, such optical component may be mounted on an appropriate mounting for suitable physical disposition change. For example, such optical component may be mounted on a frame that is spring-biased to press against adjustment screw, mounted to be moved via an adjustment mechanism such as manual adjustment, a voice coil, a linear or non-linear electro-mechanical actuator or motor. A stepper motor is an example of an electro-mechanical actuator that can directly or indirectly via for example screws, gears, chains, belts, etc.) perform physical disposition change on an appropriately mounted optical component, for example. Even hand-adjustable mountings can be provided to permit manual alignment by, for example, turning a screw by a hand tool or manually adjusting the mounting angle/translation distance via an appropriate hand tool action on the hand-adjustable mounting. These are only examples and are not intended to be limiting of various embodiments of the invention herein.

Figure 1:
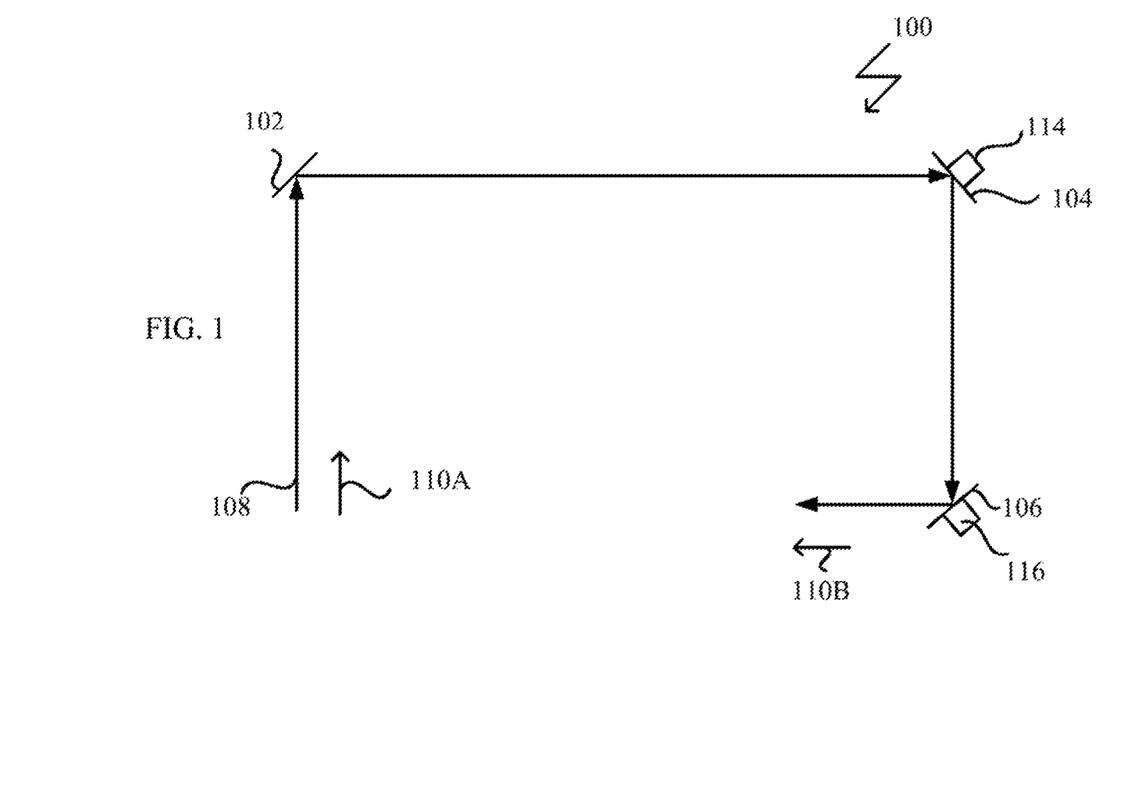
FIG. 1 shows an example simplified optical train having three example optical components mirrors).

FIG. 1 shows an example simplified optical train 100 having three mirrors 102, 104, and 106. Mirror 106 is downstream relative to mirror 104, which in turn is downstream relative to mirror 102. A laser beam 108 enters optical train 100 in the direction of arrow 110A and exits optical train 100 in the direction of arrow 110B.

There are also shown two sensors 114 and 116. Sensor 114 is downstream of mirror 102, whereas sensor 116 is downstream of mirror 104. In an embodiment, sensor 114 is attached to the back of mirror 104. In an embodiment, sensor 114 and/or sensor 116 are/is configured to detect a laser wavelength of about 193 nm. In another embodiment, sensor 114 and/or sensor 116 are/is configured to detect a laser wavelength of about 248 nm. The term "about 193 nm" refers to a wavelength of 193 nm+/−10% and more preferably a laser wavelength of 193 nm+/−5% and even more preferably a laser wavelength of 193 nm+/−2% or less. The term "about 248 nm" refers to a wavelength of 248 nm+/−10% and more preferably a laser wavelength of 248 nm+/−5% and even more preferably a laser wavelength of 248 nm+/−2% or less. It should be understood, however, that embodiments of the invention are not limited to any particular laser wavelength even though they may be highly useful with respect to laser wavelengths employed to produce the deep UV (DUV) or Extreme UV (EUV) lights employed for photolithography of semiconductor wafers.

In the example of FIG. 1, although mirror 104 is designed primarily to reflect light, a small amount of light may pass through its reflective layer and may be sensed by sensor 114. In an example, it has been observed that sensors are often capable of detecting light oven if the reflective layer of a mirror in front of it reflects more than 99% of the light impacting the reflective layer. This approach of affixing the sensor to the back of an optical component (such as mirror 104) is a highly space-efficient approach to enable laser beam alignment in accordance with one or more embodiments of the invention. Additionally, if an existing optical train design is retrofitted with sensors to enable laser beam alignment, the space-efficiency and simplicity of this approach makes such retrofitting simple.

Figure 2A:
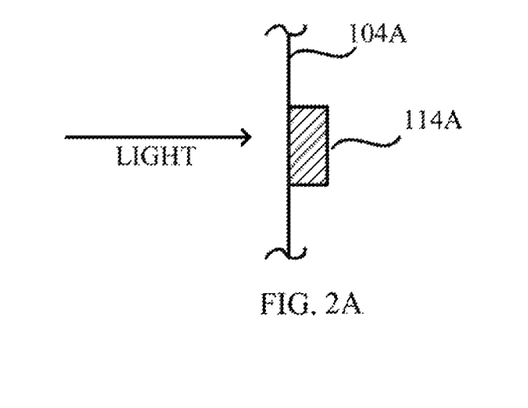
FIG. 2A shows a sensor attached to the back of a mirror.

This is shown in FIG. 2A, wherein a sensor 114A is shown attached to the back of mirror 104A. The attachment may be made using an appropriate adhesive method or may be made using a mechanical fixture, for example. The sensor 114A may be directly attached to the back of the mirror 104A with the sensor face pointing to receive light entering the reflective layer from upstream. Alternatively, a physical component having a shape of a plate or any other physical shape may have one or more small holes drilled in it, and the sensor face may face this physical component such that only a small portion of the sensor is available to receive light. The assembly that comprises the sensor and the physical component may then be positioned such that mirror 104A is disposed between the upstream optical component that performs the rasterizing the beam and the assembly that comprises the sensor and the physical component. This enables a relatively larger sensor (which may be a less expensive or easier to produce) to appear as a much smaller sensor since it receives only a portion of the laser beam footprint, thereby improving detection granularity and/or accuracy, which leads to improved correlation data.

Figure 2B:
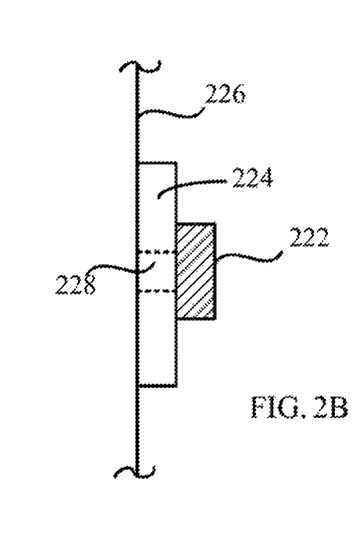
FIG. 2B is a side view showing a sensor attached to plate having a through-hole.

FIG. 2B is a side view showing sensor 222 being attached to plate 224 (a plate is used as an example here and not meant to be limiting of the shape of the physical component that restricts the size of the laser beam impacting the sensor), which is in turn attached to the back of mirror 226. A hole 228 in plate 224 allows only a portion of sensor 222 to receive light via hole 228, with other portions of the sensor face of sensor 222 blocked by the plate 224, thereby enabling sensor 222 to act as a mach smaller sensor than the physical size of the sensor face of sensor 222 would indicate.

Figure 2C:
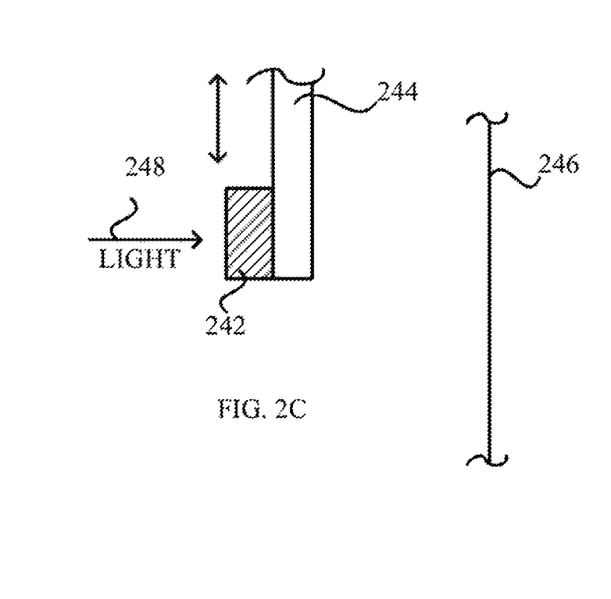
FIG. 2C shows a sensor attached to a fixture that removably extends down in front of the mirror to receive a laser beam as the laser beam scans across the sensor.

The downstream sensor can also be mounted on a fixture to be removably extended into the laser path in front of a downstream mirror to receive light from the upstream mirror. This is shown in FIG. 2C whereas sensor 242 is attached to a fixture 244 and extended down in front of mirror 246 to receive laser beam 248 as it scans across sensor 242. In this position, sensor 242 and fixture 244 are positioned such that the assembly that comprises sensor 242 and fixture 244 is disposed between the downstream mirror and the upstream mirror that performs the rasterizing the laser beam. After alignment is achieved, fixture 244 and sensor 242 may be withdrawn upward or away, thereby not interfering with the laser operation.

Figure 2D:
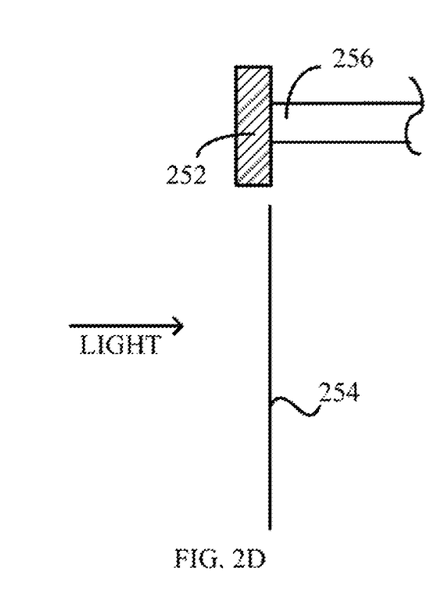
FIG. 2D shows a sensor disposed outside of the periphery of a mirror.

The downstream sensor may also be removably or permanently mounted beside (i.e., outside of the periphery of) a downstream optical component (such as a mirror) to receive light from an upstream optical component that performs the rasterizing the beam. Side mounting is beneficial in situations where it is necessary to change the normal beam path to obtain correlation data (such as in an optical resonator) or when it is desired to minimize exposing the sensor to laser light during production (e.g., after the alignment is performed and the optical train is employed for photolithography production purposes, minimizing sensor exposure to the laser light during production may extend the useful life of the sensor). This is shown in FIG. 2D wherein sensor 252 is disposed, either removably or permanently, to the side of (i.e., outside of the periphery of) mirror 254 on fixture 256.

In one or more embodiments, a downstream sensor does not have to be associated, either logically or physically, with a downstream optical component in order to receive light from and achieve alignment for an upstream optical component. The pairing of a downstream sensor and an upstream optical component to allow that downstream sensor to receive light as the physical disposition of the upstream optical component is changed and to create the data correlation is important; how the sensor is mounted and whether it is logically or physically associated with any other component is embodiment-specific and not the central idea of the invention herein.

Figure 3:
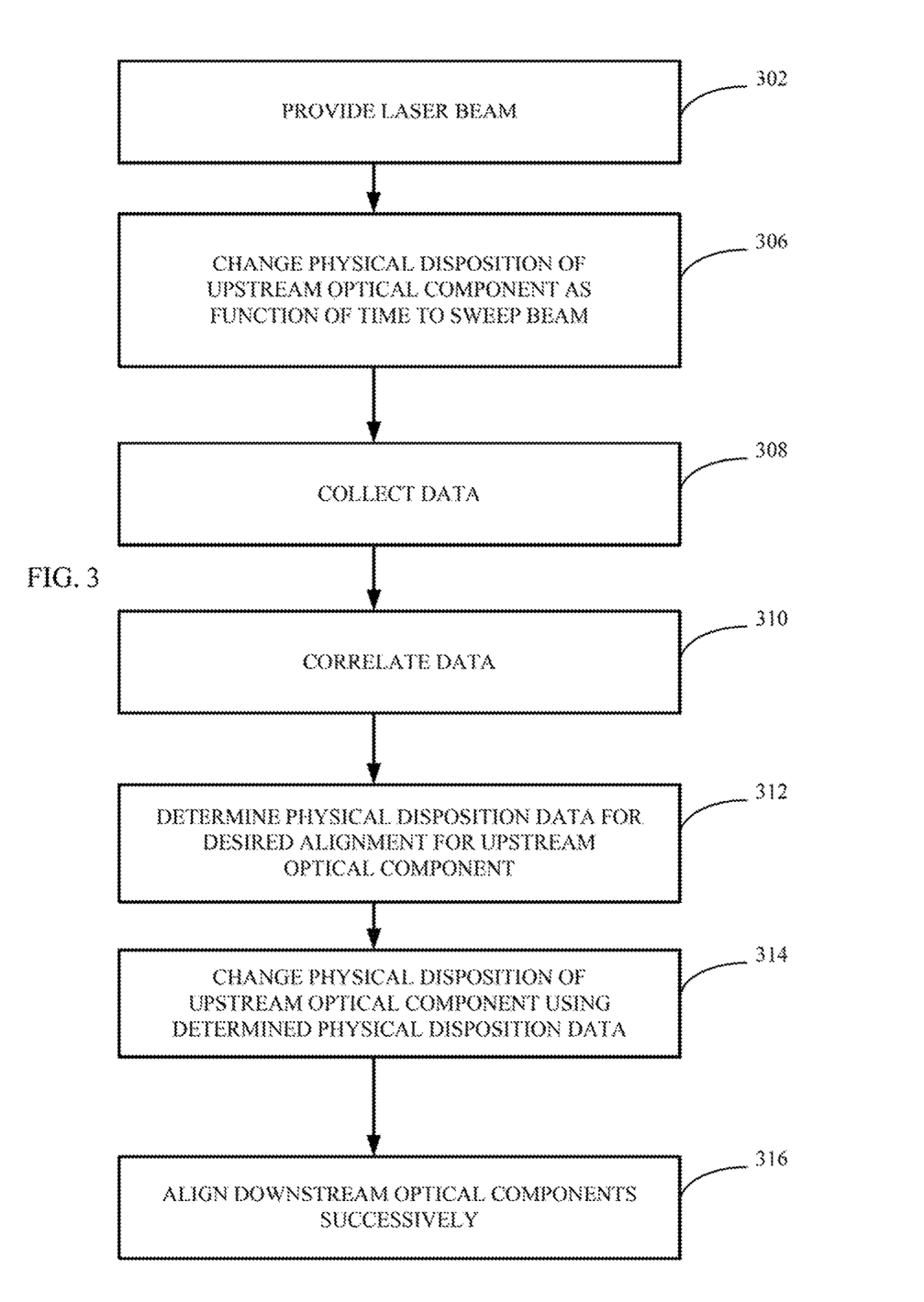
FIG. 3 shows, in accordance with one or more embodiments of the invention, a method for laser beam alignment.

FIG. 3 shows, in accordance with one or more embodiments of the invention, a method for laser beam alignment. In step 302, a laser beam is provided and allowed to impact upon an upstream optical component (such as mirror 102 of optical train 100 of FIG. 1). In step 306, the physical disposition of the upstream optical component is changed as a function of time to allow the laser beam exiting the upstream optical component to scan across a portion of or the entirety of a downstream sensor. The change in the physical disposition of the upstream optical component may be achieved via X/Y/Z translation and/or pitch/yaw/tilt pointing change, for example.

As the laser beam scans across the downstream sensor, data is collected (step 308) from the downstream sensor pertaining to the impact of the laser beam on the sensor face. Data is also collected from the hardware associated with the upstream optical component pertaining to the physical disposition of the upstream optical component. For example, the yaw, pitch, and/or tilt pointing angle(s) of a mirror may be obtained from its electro-mechanical actuator or from other mounting hardware (in the case where no electro-mechanical actuator is employed) and correlated against the laser beam impact data on the sensor.

In step 310, a table or database of correlation data is then generated to indicate the laser beam point of impact as a function of upstream optical component's physical disposition and car to inform how the laser beam point of impact changes the upstream optical component physical disposition is changed as a function of time.

In step 312, the correlation data is used to determine the physical disposition (e.g., X/Y/Z translation and/or yaw/pitch/tilt pointing) of the upstream optical component that is appropriate to achieve a desired laser beam impact point on the downstream optical component and/or on the downstream sensor.

In step 314, the upstream optical component physical disposition is changed to achieve the desired laser beam impact point on the downstream optical component and/or the downstream sensor, using the correlation data calculated in step 310 and/or the desired physical disposition data determined in step 312. At this point, the laser beam exiting out of the upstream component is aligned with respect to the downstream optical component (e.g., the downstream optical component and/or the downstream sensor).

In optional step 316, successive optical components downstream of the downstream optical component may be aligned using a sensor downstream from that optical component. The alignment may be done successively (and iteratively if desired) until the entire optical train is aligned for the laser beam.

Figure 4A:
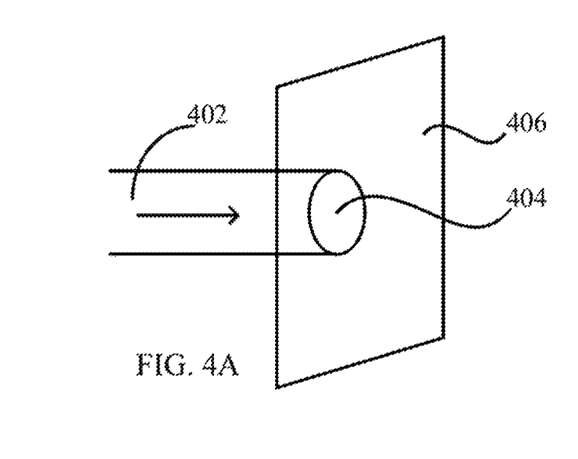
FIG. 4A shows a laser beam having a laser beam footprint as it crosses a virtual plane.
Figure 4B:
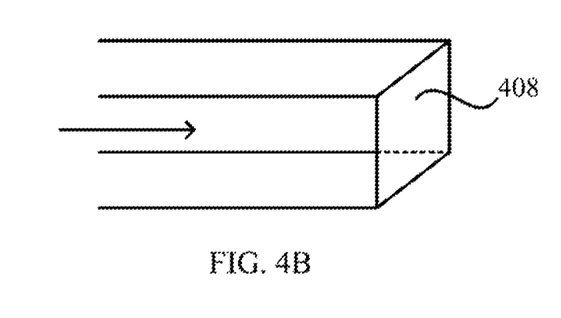
FIG. 4B shows a laser beam having a rectangular laser beam footprint
Figure 4C:
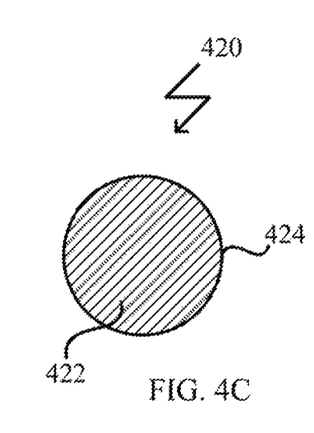
FIG. 4C shows a sensor having a sensor face area and a perimeter.

As discussed, the laser beam scans across a portion of or the entirety of the downstream sensor as the upstream optical component physical disposition is changed. There are some considerations which may be useful to take into account when using sensor data to determine the laser beam point of impact. For ease of discussion, the concept of a laser beam footprint is employed. FIG. 4A shows a laser beam 402 having a laser beam footprint 404 as it crosses a virtual plane 406. The footprint may have any shape, including circular (404 as in the case of FIG. 4A), rectangular (408 of FIG. 4B) or any arbitrary shape. FIG. 4C shows a sensor 420 having a sensor face area 422 and a perimeter 424. The footprints of FIGS. 4A and 4B and the sensor of FIG. 4C will now be employed as examples to discuss some of the considerations that may be useful in creating the aforementioned correlation data.

In one or more embodiments, the sensor employed may have a smaller sensor face area than the footprint of the laser beam. In some situations, a sensor large enough to sense the entire laser beam footprint may be very expensive or non-existent, especially in laser high frequency ranges while a smaller version of such a sensor is available at a more affordable cost.

Figure 5A:
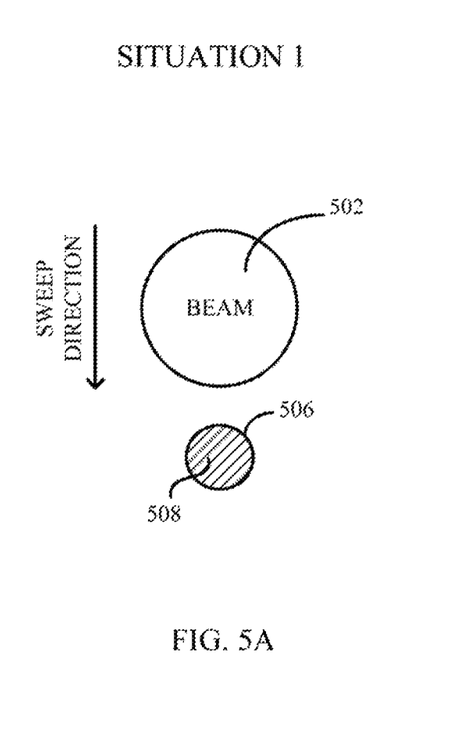
FIG. 5A shows the situation whereas laser beam footprint of a laser beam impacts outside of the perimeter of a sensor face.

As the footprint of the laser beam begins its scan responsive to the change in the upstream optical component physical disposition, there may initially be no overlap between the laser beam footprint and the sensor face. This is shown in FIG. 5A (situation 1), where laser beam footprint 502 of a laser beam impacts outside of perimeter 506 of a sensor face 508. At this point, the sensor registers no laser light impacting upon it.

Figure 5B:
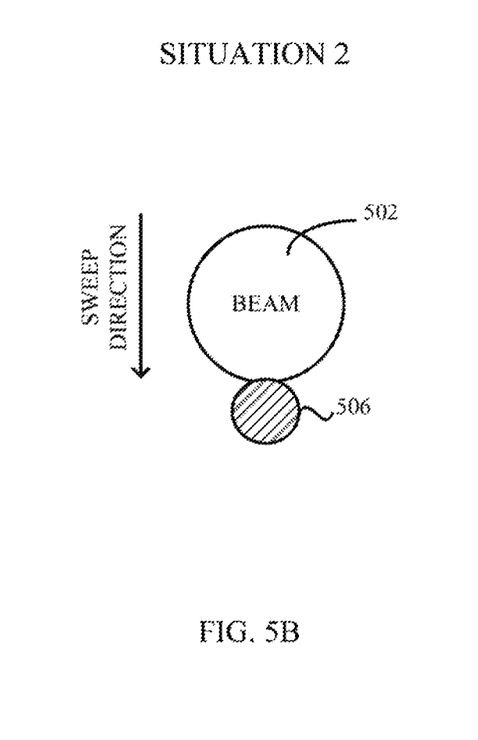
FIG. 5B shows the situation whereas laser beam footprint of a laser beam overlaps the perimeter of a sensor face.

At some point, the laser beam footprint 502 begins to intersect the perimeter 506 of sensor face 508. This is shown in FIG. 5B (situation 2). As the laser beams begins to intersect the sensor face during its scan, the sensor Perceives some laser light impacting upon its sensor face and there is a change in the data output by the sensor. This information is recorded, along with the corresponding physical disposition data of the upstream optical component at the time the intersection begins.

The laser beam footprint 502 continues to scan across the sensor face 508 and at some point leaves sensor face 508. As the laser beam footprint 502 leaves and no longer overlaps with perimeter 506 of sensor face 508 (situation 3 shown in FIG. 5C), the sensor transitions from detecting some laser light to none and its sensor output changes accordingly. This is noted, along with the corresponding physical disposition data of the upstream optical component at the time the intersection ends.

Figure 5C:
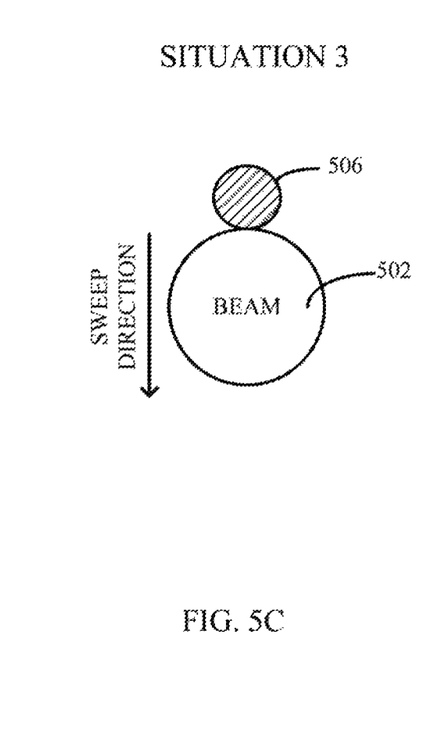
FIG. 5C shows the situation whereas laser beam footprint of a laser beam has left the perimeter of a sensor face.

The physical disposition data collected in situations 2 (overlap begins) and situation 3 (overlap ends) provides information regarding the point of impact of the laser beam relative to the physical disposition data of the upstream optical component (obtained from the electro-mechanical actuator for the optical component, for example).

In some cases, multiple passes across a portion of or the entirety of the face of the sensor (which multiple passes in the vicinity of the sensor may be undertaken responsive to data sensed in situation 2 of FIG. 5B) in one or more directions (such as horizontal, vertical, or horizontal+vertical) or in overlapping or non-overlapping paths may provide improved information regarding the center (or perimeter) of the laser footprint vs. the center (or perimeter) of the sensor face. In other cases, data collecting continues for the duration of time between situations 2 (FIG. 5B) when overlap begins and situation 3 (FIG. 5C) when overlap ends to facilitate extrapolation in order to, additionally or alternatively, improve the correlation data regarding the position of the laser beam foot print vs. the position of the sensor face.

This permits a more refined determination of the laser beam point of impact, thereby improving the accuracy of the correlation data. This is true even if the sensor face is the same size as or larger than the laser beam footprint since this embodiment relies, at least in part, on when the overlap starts and/or ends, not solely on whether the sensor face can capture the entire footprint of the laser beam.

As mentioned, the sensor may be mounted to a physical component (such as, for example and without limitation, a plate) with a hole drilled in it, and the sensor receives laser light through this hole in the physical component to make the effective sensor area appear smaller relative to the received laser light. This has the advantage of improving data resolution and granularity, thereby also improving the accuracy of the correlation data.

With respect to laser beam diagnostic, the laser light received by the sensor may also be employed to characterize or to diagnose the laser beam. This can be done with a sensor receiving the laser light from its upstream optical component and a comparison of the laser light characteristics against some reference for example. As another example, the relevant characteristics of the laser beam can be analyzed using existing laser beam diagnostic software and/or techniques. The laser light characteristic may be, for example, one or more of its luminance, frequency, phase, energy, etc. The sensor can also keep a history of the laser light characteristics received over time. This has the advantage of enabling engineers to perform data analysis to identify which optical component tends to fail earlier and quicker and to address the weak link in the optical train (since failure of any one poorly engineered optical component would result in the entire optical train being inoperable even though other optical components may still have quite a long life left). This also has the advantage of enabling engineers to detect the pattern of light characteristics degradation, and to predict when maintenance would be required in order to optimize the maintenance regime and/or schedule.

In one or more embodiments, monitoring the plurality of sensors in an optical train yields data which may be employed to obtain a rough determination of the location in the optical train where failure occurs. For example, if the characteristics of a laser beam are found by sensor A to be satisfactory but sensor B immediately downstream detects anomalies in the laser beam characteristics, this evidence may suggest that the damage occurs somewhere between sensor A and sensor B in the optical train, permitting engineers to more quickly localize the failure and repair. In an optical train that may have 20-40 optical components, the ability to quickly localize the failure site is a valuable time saver.

Due to the space-efficient approach of placing a downstream sensor on the back of or proximate to a downstream optical component (as discussed earlier), embodiments of the invention render it possible to quickly and cost-efficiently retrofit an existing optical train to provide the ability to perform laser beam diagnostic.

In performing laser beam diagnostic, a smaller sensor permits a higher degree of granularity with respect to damage inspection of the upstream optical component. This is contrary to the current school of thought, which strives to create sensors large enough to cover the laser footprint. As discussed, a hole-bearing physical component may be employed to provide a small aperture tsar sensing by the sensor, thereby improving diagnostic accuracy. However, even larger sensors can be employed for diagnostic purposes (e.g., by considering the energy level or some composite information), to localize the problem down to between two sensors in an optical train, and to build a history of laser beam characteristics over time for the purposes of improving optical component designs and optimizing maintenance.

Figure 6:
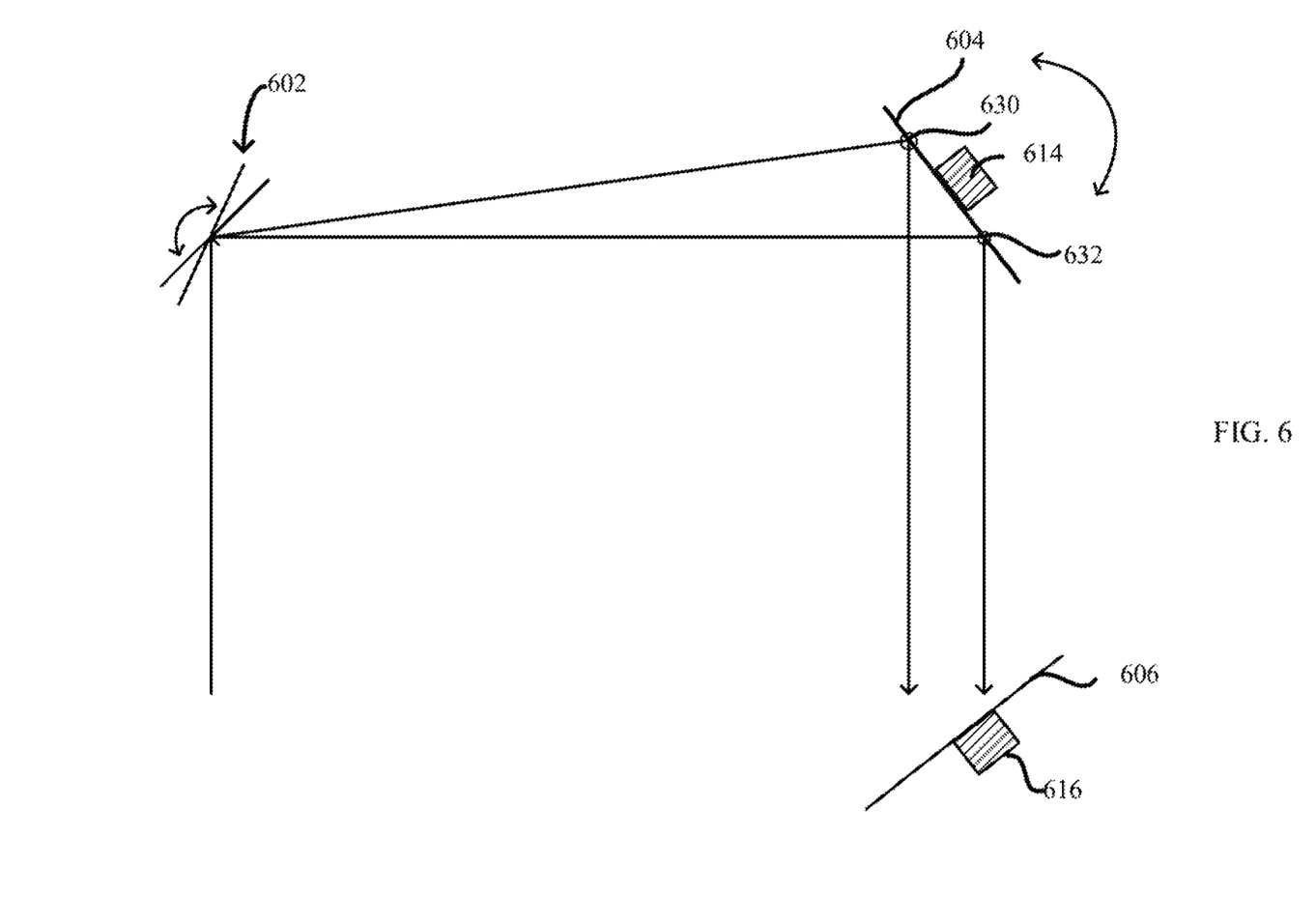
FIG. 6 shows three example mirrors and two downstream sensors.

In one or more embodiments, an upstream optical component may be "inspected" one small area at a time. For example, a mirror may have a small area of its surface inspected at a time using the techniques disclosed herein. FIG. 6 shows three example mirrors 602, 604, and 606, with mirror 606 being downstream of mirror 604. Mirror 604 is in turn downstream of mirror 602. Sensor 614 is downstream of mirror 602, whereas sensor 616 is downstream of mirror 604. By changing the physical disposition (e.g., X/Y/Z translation and/or yaw/pitch/tilt pointing) of mirror 602, the laser beam bouncing off mirror 602 may impact different areas (such as 630 or 632) of mirror 604. Each time a new area of mirror 604 is illuminated, that area of mirror 604 may be inspected by a sensor downstream of it. The inspection may be performed by changing the physical disposition of mirror 604 (such as for example by changing its pitch/yaw/tilt pointing), thereby scanning the beam exiting mirror 604 across downstream sensor 616. Sensor 616 may then record the beam characteristics to ascertain the health of that area (such as 630 or 632) on its upstream mirror 604. In this manner, each area of mirror 604 may be examined in turn for issues such as, for example, localized reflective surface degradation. Multiple areas of mirror 604 may be inspected in turn by this technique, in an example embodiment.

Figure 7:
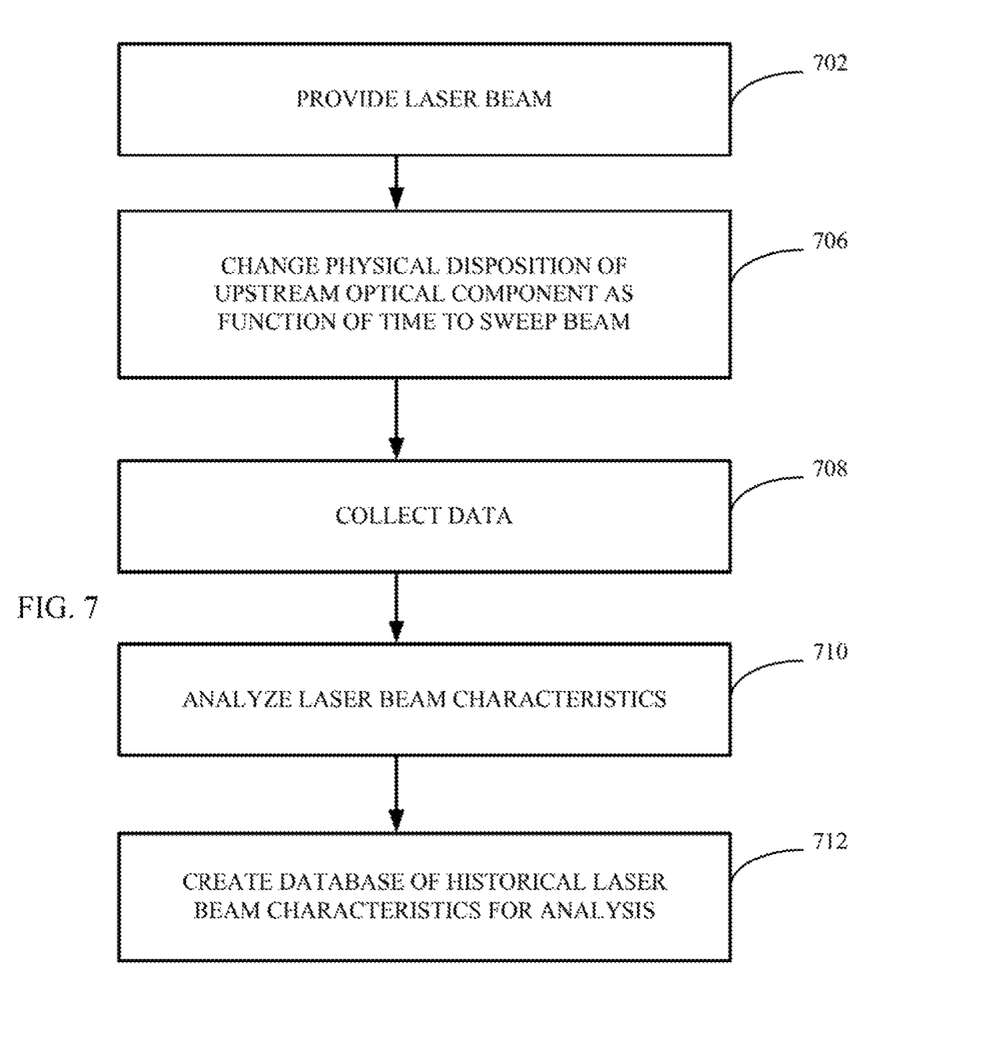
FIG. 7 shows, in accordance with an embodiment of the invention, a method for performing beam diagnostic.

FIG. 7 shows, in accordance with an embodiment of the invention, a method for performing beam diagnostic. In step 702, a laser beam is provided and allowed to impinge upon an upstream optical component (such as mirror 102 of optical train 100 of FIG. 1). In step 706, the physical disposition of the upstream optical component is changed to allow the laser beam to scan across a portion of or the entirety of a downstream sensor. The change in the physical disposition of the upstream optical component may be achieved via X/Y/Z translation and/or pitch/yaw/tilt pointing change, for example.

As the laser beam scans across the downstream sensor, data is collected (step 708) by the downstream sensor pertaining to laser beam characteristics to be monitored. If alignment is already done earlier (for example in accordance with the steps of FIG. 3), the correlation data has already been obtained earlier to facilitate accurate laser beam pointing and physical disposition data may be provided to enable the upstream optical component to point the laser beam directly at the downstream sensor to save time for example.

In step 710, the laser beam characteristics are analyzed to detect problems with the laser beam characteristics (which indicates problems with upstream optical component or components). Detection can be performed, for example, by comparing the laser beam characteristics received by one or more of the sensors to reference laser beam characteristics to detect if one or more relevant characteristics (e.g., power, coherence, divergence, etc.) has fallen below the threshold for acceptable performance. Diagnosis can also include comparing the laser beam characteristics received by one or more of the sensors to historical laser beam characteristics data acquired in the past for the same sensor/sensors to detect possible change or degradation trend in beam quality. In an embodiment, the laser beam characteristics data received over time by one or more of the sensors can help engineers ascertain a maintenance forecast as to when maintenance/replacement may be needed for the optical component that is upstream of the sensor.

If multiple sensors are monitored in an optical train, it is possible to localize any problem down to the components (optical or non-optical) between two sensors as discussed earlier. For example, if the laser beam characteristics are ascertained to be acceptable from sensors 1, 2, and 3 but sensor 4 in the optical train informs that the laser beam quality has been compromised, engineers can reasonably deduce that the problem likely is localized to components between sensor 3 and sensor 4 (in this example, the laser beam traverses the path that is detectable by sensors 1, 2, 3, and 4 in turn).

In an optional step 712, the laser beam characteristics may be recorded over time to create a database of time-stamped laser beam characteristics data. This database enables engineers to optimize maintenance and/or predict failure and/or perform failure analysis.

In one or more embodiments, the desired alignment for each optical component may include the consideration of directing the laser beam to impact a different sub-area of a downstream optical component to avoid unduly overstressing any particular sub-area of the downstream optical component. For example, during a first period of photolithography production (e.g., for production processing semiconductor wafers) of a few weeks or months or a number of laser pulses, the upstream optical component X may direct the exit laser beam to impact upon a sub-area A of the downstream optical component Y. At the expiration of the first period of operation period, the upstream optical component X may change its physical disposition to direct the exit laser beam to impact upon a different sub-area B of the downstream optical component Y. The approach is similar to that discussed in connection with the alignment steps of FIG. 3 except that the desired alignment now includes considering switching among different sub-areas of the downstream optical component to avoid overstressing any one sub-area over time. Alignment of the laser beam may be performed by the downstream optical component Y or by components downstream oft in order to ensure that the laser beam that exits the optical train impacts the desired location/target irrespective of which sub-area/which operation period is involved. This alignment aspect has been discussed herein.

A schedule may be worked out in advance to expose different sub-areas of the downstream optical components to the laser beam over time to avoid unduly overstressing any sub-area. Switching among sub-areas of a downstream optical component may also be performed responsive to diagnostic data from sensors that inform of laser beam quality degradation problem with an upstream optical component(s) (e.g., using the localization concept discussed earlier). Further, since the entire optical train or part thereof can be aligned as discussed earlier, modeling can be employed to work out various different alternative laser beam paths responsive to different physical disposition settings of the individual optical components to both ensure that no sub-area on any optical component is unduly stressed and that the laser beam, upon exiting the optical train, is correctly aligned for use as mentioned earlier. This approach may advantageously allow the optical train to operate for a longer period of time before maintenance may be required due to laser beam quality problem arising from optical component (such as for example mirror) degradation.

As can be appreciated from the foregoing, embodiments of the invention permit the laser beam to be aligned and/or diagnosed in a highly space-efficient, lower cost and/or retrofit-friendly manner, either when a single optical component is involved or when multiple optical components are involved in an optical train.

The following examples are various example implementations of devices and procedures that illustrate some implementations contemplated in this disclosure.

Example 1

A method for optimizing a laser beam in a photolithography system, the laser beam traversing an optical train that comprises plurality of optical components, comprising:

rasterizing, using a first optical component of the plurality of optical components such that the laser beam that exits the first optical component scans, responsive to the rasterizing using the first optical component, at least partially across a first sensor;

forming a correlation, using data obtained from the first sensor during the rasterizing using the first optical component, between the physical disposition of the first optical component and a point of impact of the laser beam;

ascertaining a first physical disposition of the first optical component, using data obtained from the correlation, that would cause the point of impact of the laser beam that exits the first optical component to impact a desired point on a second optical component; and aligning the laser beam that exits the first optical component with respect to the second optical component by aligning the first optical component in accordance with the first physical disposition.

Example 2

The method of example 1 wherein the footprint of the first sensor is smaller than the footprint of the laser beam.

Example 3

The method of example 1 wherein the rasterizing the laser beam that exits the first optical component comprises changing a pointing of the first optical component.

Example 4

The method of example 1 wherein the rasterizing the laser beam that exits first optical component comprises translating the position of the first optical component.

Example 5

The method of example 1 wherein the first sensor is disposed outside of the periphery of the second optical component.

Example 6

The method of example 1 wherein the first sensor is positioned such that the second optical component is disposed between the first sensor and the first optical component.

Example 7

The method of example 6 wherein the first sensor is attached to the second optical component using an adhesive, wherein the second optical component is a mirror.

Example 8

The method of example 6 wherein the first sensor is attached to the second optical component using a mechanical fixture, wherein the second optical component is a mirror.

Example 9

The method of example 6 further comprising a physical component having a hole configured to permit only a portion of the laser beam that exits the first optical component to enter the first sensor through the hole, the physical component being positioned between the first optical component and the first sensor, the hole having a smaller footprint than the footprint of the laser beam that exits the first optical component, wherein the first sensor and the physical component are positioned such that the second optical component is disposed between the first optical component and the assembly that comprises the first sensor and the physical component.

Example 10

The method of example 6 further comprising a physical component having a hole configured to permit only a portion of the laser beam that exits the first optical component to enter the first sensor through the hole, the physical component being positioned between the first optical component and the first sensor, the hole having a smaller footprint than the footprint of the laser beam that exits the first optical component, wherein the first sensor and the physical component are positioned such that the assembly that comprises the first sensor and the physical component is disposed between the second optical component and the first optical component.

Example 11

The method of example 1 wherein the first sensor is disposed between the second optical component and the first optical component.

Example 12

The method of example 1 wherein the first sensor is disposed on a fixture that is movable such that the first sensor can be moved, during photolithography production, away from a first sensor location, wherein when the first sensor is positioned at the first sensor location during the rasterizing using the first optical component, the first sensor is disposed between the first optical component and the second optical component.

Example 13

The method of example 1 wherein the first sensor is configured to detect a laser wavelength of about 193 nm.

Example 14

The method of example 1 wherein the first sensor is configured to detect a laser wavelength of about 248 nm.

Example 15

The method of example 1 further comprising:
rasterizing, using the second optical component of the plurality of optical components, such that the laser beam that exits the second optical component scans, responsive to the rasterizing using the second optical component, at least partially across a second sensor;

forming a correlation, using data obtained from the second sensor during the rasterizing using the second optical component, between the physical disposition of the second optical component and the point of impact of the laser beam that exits the second optical component;

ascertaining a second physical disposition of the second optical component, using data obtained from the correlation between the physical disposition of the second optical component and the point of impact of the laser beam exiting the second optical component, that would cause the point of impact of the laser beam exiting the second optical component to impact a desired point on a third optical component; and aligning the laser beam that exits the second optical component with respect to the third optical component by aligning the second optical component in accordance with the second physical disposition determined by the ascertaining the second physical disposition.

Example 16

A photolithography system having an optical train comprising a plurality of optical components, the plurality of optical components configured to at least pass a laser beam from one location to another location, comprising:

a first optical component configured to at least perform rasterizing a laser beam exiting the first optical component, causing the laser beam exiting the first optical component to at least partially scan across a first sensor; and a second optical component configured to at least receive the laser beam that exits the first optical component and perform rasterizing the laser beam exiting the second optical component, causing the laser beam exiting from the second optical component to at least partially scan across a second sensor.

Example 17

The photolithography system of example 16 wherein the footprint of the first sensor is smaller than the footprint of the laser beam exiting the first optical component.

Example 18

The photolithography system of example 16 wherein the rasterizing using the first optical component comprises changing a pointing of the first optical component.

Example 19

The photolithography system of example 16 wherein the rasterizing using the first optical component comprises translating the position of the first optical component.

Example 20

The photolithography system of example 16 wherein the first sensor is positioned such that the second optical component is disposed between the first sensor and the first optical component.

Example 21

The photolithography system of example 20 wherein the first sensor is attached to the second optical component using an adhesive, whereby the second optical component is a mirror.

Example 22

The photolithography system of example 20 wherein the first sensor is coupled to a physical component having a hole configured to permit only a portion of the laser beam that exits the first optical component to enter the first sensor through the hole, the hole having a smaller footprint than the footprint of the laser beam that exits the first optical component, wherein the first sensor and the physical component are positioned such that the second optical component is disposed between the first optical component and the assembly that comprises the first sensor and the physical component.

Example 23

The photolithography system of example 16 wherein the first sensor is configured to detect a laser wavelength of about 193 nm.

Example 24

The photolithography system of example 16 wherein the first sensor is configured to detect a laser wavelength of about 248 nm.

Example 25

A method for diagnosing a laser beam, the laser beam configured to generate one of deep ultraviolet (DUV) light and extreme ultraviolet (EUV) light for photolithography, the laser beam traversing at least a first optical component and a second optical component of an optical train in a photolithography system, comprising:
rasterizing, using the first optical component, such that the laser beam that exits the first optical component scans at least partially across a first sensor;
rasterizing, using a second optical component, such that the laser beam that exits the second optical component scans at least partially across a second sensor; and
ascertaining laser beam characteristics from data received from the first sensor and second sensor to facilitate performing the diagnosing the laser beam.

Example 26

The method of example 25 wherein the diagnosing includes localizing laser beam quality problem to components in a segment of the optical train between the first sensor and the second sensor.

Example 27

The method of example 25 wherein the diagnosing includes comparing laser beam characteristics from data obtained by at least one of the first sensor and the second sensor to reference laser beam characteristics.

Example 28

The method of example 25 wherein the diagnosing includes comparing laser beam characteristics from data obtained by the first sensor to historical laser beam characteristics data obtained in the past from the first sensor.

Example 29

The method of example 25 further comprising ascertaining a maintenance forecast for the first optical component from laser beam quality degradation trend that is derived from data received over time by the first sensor.

Example 30

A method for forming a laser beam, the laser beam configured to generate one of deep ultraviolet (DUV) light and extreme ultraviolet (EUV) light for photolithography, the laser beam traversing at least a first optical component and a second optical component of an optical train in a photolithography system, comprising:
directing the laser beam, using the first optical component, to a first sub-area of the second optical component during a first period of operation of the photolithography system; and
thereafter directing the laser beam, using the first optical component, to a second sub-area of the second optical component during a second period of operation of the photolithography system, whereby one or more components in the optical train are configured to align the laser beam such that the laser beam point of impact alter exiting the optical train is unchanged irrespective whether the photolithography system operates during the first period of operation or during the second period of operation.

Example 31

The method of example wherein switching from the first su area to the second sub-area is performed responsive to a predetermined schedule.

Example 32

The method of example 30 wherein switching from the first sub-area to the second sub-area is performed responsive to analysis of laser beam characteristics of the laser beam that exits the second optical component.

While this invention has been described in terms of several preferred embodiments, there are alterations, permutations, and equivalents, which fall within the scope of this invention. The invention should be understood to also encompass these alterations, permutations, and equivalents. It should also be noted that there are many alternative ways of implementing the methods and apparatuses of the present invention. Although various examples are provided herein, it is intended that these examples be illustrative and not limiting with respect to the invention.

What is claimed is:
1. A method for optimizing a laser beam in a photolithography system, the laser beam traversing an optical train that comprises plurality of optical components, comprising:
rasterizing, using a first optical component of the plurality of optical components such that the laser beam that exits the first optical component sweeps, responsive to the rasterizing using the first optical component, at least partially across a first sensor;
forming a correlation, using data obtained from the first sensor during the rasterizing using the first optical component, between the physical disposition of the first optical component and a point of impact of the laser beam;

ascertaining a first physical disposition of the first optical component, using data obtained from the correlation, that would cause the point of impact of the laser beam that exits the first optical component to impact a desired point on a second optical component; and aligning the laser beam that exits the first optical component with respect to the second optical component by aligning the first optical component in accordance with the first physical disposition, wherein a footprint of the first sensor is smaller than a footprint of the laser beam.

2. A method for optimizing a laser beam in a photolithography system, the laser beam traversing an optical train that comprises plurality of optical components, comprising:

moving a first optical component of the plurality of optical components such that the laser beam that exits the first optical component sweeps, responsive to moving the first optical component, at least partially across a first sensor;

forming a correlation, using data obtained from the first sensor during moving the first optical component, between the physical disposition of the first optical component and a point of impact of the laser beam;

ascertaining a first physical disposition of the first optical component, using data obtained from the correlation, that would cause the point of impact of the laser beam that exits the first optical component to impact a desired point on a second optical component, the first sensor being positioned such that the second optical component is disposed between the first sensor and the first optical component; and aligning the laser beam that exits the first optical component with respect to the second optical component by aligning the first optical component in accordance with the first physical disposition, the method further comprising using a physical component having a hole configured to permit only a portion of the laser beam that exits the first optical component to enter the first sensor through the hole, the physical component being positioned between the first optical component and the first sensor, the hole having a smaller footprint than the footprint of the laser beam that exits the first optical component, wherein the first sensor and the physical component are positioned such that the assembly that comprises the first sensor and the physical component is disposed between the second optical component and the first optical component.

3. A photolithography system having an optical train comprising a plurality of optical components, the plurality of optical components configured to at least pass a laser beam from one location to another location, comprising:

a first optical component configured to at least perform rasterizing a laser beam exiting the first optical component, causing the laser beam exiting the first optical component to at least partially sweep across at least a portion of a first sensor; and a second optical component configured to at least receive the laser beam that exits the first optical component and perform rasterizing the laser beam exiting the second optical component, causing the laser beam exiting from the second optical component to at least partially sweep across at least a portion of a second sensor, wherein a footprint of the first sensor is smaller than a footprint of the laser beam exiting the first optical component.

4. A method for optimizing a laser beam in a photolithography system, the laser beam traversing an optical train that comprises plurality of optical components, comprising:

moving a first optical component of the plurality of optical components such that the laser beam that exits the first optical component sweeps, responsive to moving the first optical component, at least partially across a first sensor;

forming a correlation, using data obtained from the first sensor during moving the first optical component, between the physical disposition of the first optical component and a point of impact of the laser beam;

ascertaining a first physical disposition of the first optical component, using data obtained from the correlation, that would cause the point of impact of the laser beam that exits the first optical component to impact a desired point on a second optical component;

aligning the laser beam that exits the first optical component with respect to the second optical component by aligning the first optical component in accordance with the first physical disposition, the first sensor being positioned such that the second optical component is disposed between the first sensor and the first optical component, and using a physical component having a hole configured to permit only a portion of the laser beam that exits the first optical component to enter the first sensor through the hole, the physical component being positioned between the first optical component and the first sensor, the hole having a smaller footprint than the footprint of the laser beam that exits the first optical component, wherein the first sensor and the physical component are positioned such that the second optical component is disposed between the first optical component and the assembly that comprises the first sensor and the physical component.

5. A photolithography system having an optical train comprising a plurality of optical components, the plurality of optical components configured to at least pass a laser beam from one location to another location, the photolithography system comprising:

a first optical component configured to cause the laser beam exiting the first optical component to at least partially sweep across at least a portion of a first sensor; and a second optical component configured to at least receive the laser beam that exits the first optical component and cause the laser beam exiting the second optical component to at least partially sweep across at least a portion of a second sensor, the first sensor being positioned such that the second optical component is disposed between the first sensor and the first optical component, the first sensor being coupled to a physical component having a hole configured to permit only a portion of the laser beam that exits the first optical component to enter the first sensor through the hole, the hole having a smaller footprint than the footprint of the laser beam that exits the first optical component, wherein the first sensor and the physical component are positioned such that the second optical component is disposed between the first optical component and the assembly that comprises the first sensor and the physical component.

* * * * *